US007743878B1

(12) United States Patent
Moore

(10) Patent No.: US 7,743,878 B1
(45) Date of Patent: Jun. 29, 2010

(54) FOLDED HORN ENCLOSURE WITH UNITARY PATHWAY

(76) Inventor: Dana A. Moore, 25—157 th Pl. SE., Bothell, WA (US) 98012

( * ) Notice: Subject to any disclaimer, the term of this patent is extended or adjusted under 35 U.S.C. 154(b) by 0 days.

(21) Appl. No.: 12/383,408

(22) Filed: Mar. 24, 2009

(51) Int. Cl.

| | |
|---|---|
| ***H05K 5/00*** | (2006.01) |
| ***G10K 11/00*** | (2006.01) |
| ***G10K 13/00*** | (2006.01) |
| ***H04R 1/20*** | (2006.01) |
| ***H04R 7/00*** | (2006.01) |

(52) U.S. Cl. ....................... 181/152; 181/145; 181/153; 181/156; 181/159; 181/192; 381/342; 381/345

(58) Field of Classification Search ................. 181/152, 181/145, 153, 156, 159, 192, 345; 381/342
See application file for complete search history.

(56) References Cited

U.S. PATENT DOCUMENTS

| | | | | |
|---|---|---|---|---|
| 3,666,041 | A * | 5/1972 | Engelhardt | 181/145 |
| 3,923,124 | A * | 12/1975 | Hancock | 181/156 |
| 4,173,266 | A * | 11/1979 | Pizer et al. | 181/156 |
| 4,213,008 | A * | 7/1980 | Helffrich | 381/89 |
| 4,313,032 | A * | 1/1982 | Thomas et al. | 381/341 |
| 4,373,606 | A * | 2/1983 | Clements et al. | 181/151 |
| 4,524,846 | A * | 6/1985 | Whitby | 181/152 |
| 4,790,408 | A * | 12/1988 | Adair | 181/152 |
| 5,187,333 | A * | 2/1993 | Adair | 181/152 |
| 6,078,676 | A * | 6/2000 | Takenaka | 381/338 |
| 6,144,751 | A * | 11/2000 | Velandia | 381/345 |
| 7,436,972 | B2 * | 10/2008 | Bouvier | 381/345 |
| 2003/0228027 | A1 * | 12/2003 | Czerwinski | 381/342 |
| 2005/0047622 | A1 * | 3/2005 | Graber | 381/342 |
| 2005/0276431 | A1 * | 12/2005 | Moore | 381/340 |
| 2006/0231328 | A1 * | 10/2006 | Moore | 181/199 |

* cited by examiner

*Primary Examiner*—Jeffrey Donels
*Assistant Examiner*—Christina Russell

(57) ABSTRACT

A folded horn enclosure including a unitary throat and horn pathway which is optimized for ⅛th space placement when operated as a stacked pair. The enclosure uses at least 2 different flare rates and is suitable for standing vertically and horizontally, and further allowing stacking of 2 enclosures to form a full-sized corner horn.

9 Claims, 2 Drawing Sheets

FOLDED HORN ENCLOSURE WITH UNITARY PATHWAY

BACKGROUND OF THE INVENTION

The present invention relates to folded horn loudspeaker enclosures. Specifically, it relates to front-loaded low frequency horn enclosures that may be used in various radiating angles comprised of at least one or more acoustically reflective surface. The present invention is relatively equally efficient standing vertically or horizontally regardless of the acoustic load present.

The current invention relates directly to my previous U.S. patent application Ser. No. 11/900,534 titled "Convertible Folded Horn with Improved Compactness" and can be considered a contribution over my previous invention in that it provides essentially the same level of performance and efficiency, is easy to construct, and provides the increase utility of being able to operate effectively whether placed horizontally or vertically which provides the ability to better operate as a single-driver unit with a smaller footprint depending on the placement, along with an optional upgrade path to a stacked pair as desired.

Front-loaded corner horn enclosures of the prior art have typically not been designed with the idea of effectively operating either vertically or horizontally in other radiating angles in addition to placement in a corner. Although rectangular-shaped horn enclosures might find themselves occasionally placed in a corner for enhanced low frequency response, such enclosures are not particularly optimized for corner operation, and while gaining a low frequency acoustic advantage of some degree from the proximate corner wall/floor boundaries, the rectangular outward shape of such an enclosure does not particularly provide an efficient use of the corner space; nor does it maximize the potential acoustic benefits of such a placement; and further, it does not lessen or prevent the deleterious effects of cabinet and/or horn mouth diffraction; the effects of which may be compounded by the common inability of a rectangular parallelepiped form with a rectangular footprint to effectively and efficiently couple acoustically with the reflective surfaces provided by a corner.

Typical corner horns of the prior art tend to be configured and optimized for corner placement and operation only. The current invention provides several advantages over such prior art; for instance, a smaller footprint can be achieved standing the present invention on its side without altering its performance which provides a slightly taller platform for a high frequency cabinet to propagate sound waves to a seated audience especially in free-standing placement away from walls and corners, but also retaining the ability to efficiently use the space of a corner or a wall-and-floor placement, if so desired. Additionally, retaining the ability to stack enclosures as a dual-driver pair in a corner while remaining competitive in the arena of overall height and general footprint size of other commercially available corner horns of the same general low frequency cutoff provides the same performance and power handling capabilities as the cited prior art device but provides the extra advantage of a smaller footprint size with more effective overall platform height for high frequency propagation when operated as a single-driver unitary cabinet.

It is therefore highly desirable to have a folded horn enclosure of relatively small proportions and footprint size (dependent on placement), capable of horizontal or vertical placement, capable of effective acoustic coupling to at least one reflective surface or combination of surfaces, such as a floor, floor-and-wall, or an environment corner as needed. Further, the ability to stack in various configurations and provide dual drivers the ability to couple electrically and acoustically provides a distinct performance advantage.

SUMMARY OF THE INVENTION

It is an object of the current invention to provide a smaller footprint than in the cited prior art without degrading the performance compared to the cited prior art.

It is an additional object of the current invention to provide the ability to operate the current invention in a horizontal or vertical placement.

It is a further object of the current invention to provide, in one embodiment, efficient corner placement and operation for optimized low frequency response and high efficiency by the invention's outward shape.

It is still another object of the current invention to provide for the easy scaling to use an 18-inch or larger diameter driver by altering a single dimension of the invention only.

The current invention utilizes a unitary throat and horn pathway, which features at least two different flare rates and exhausts in a forward direction. The horn pathway is fully enclosed which allows for free-standing operation. The current invention is also configured to provide the ability to stand on its side or on its top or bottom, allowing for different acoustic loads (radiating angles) to be used. In addition, the current invention is optimized for operation as a stacked pair for corner use, providing the full-size horn mouth and propagation angle commonly recognized in the art as being "optimum" for $\frac{1}{8}^{th}$ space loading (or at least commercially-proven) for a corner horn of this type.

DESCRIPTION OF THE INVENTION

The current invention features at least 2 different flare rates, with the overall low frequency cutoff (Fc) being mostly determined by the terminal flare rate of 38 Hz.

Figure 2:
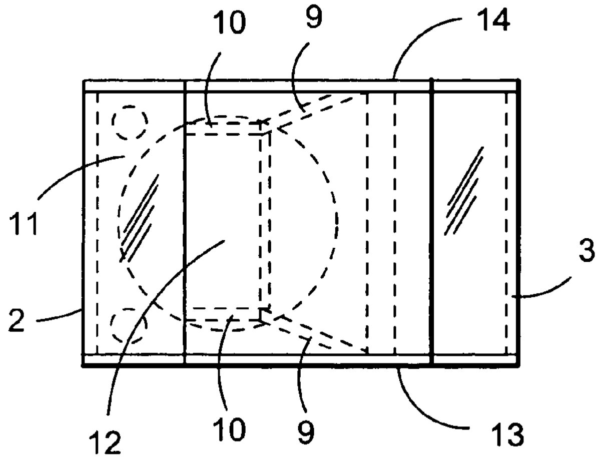
FIG. 2 is an elevation view showing the preferred embodiment from the back.
Figure 3:
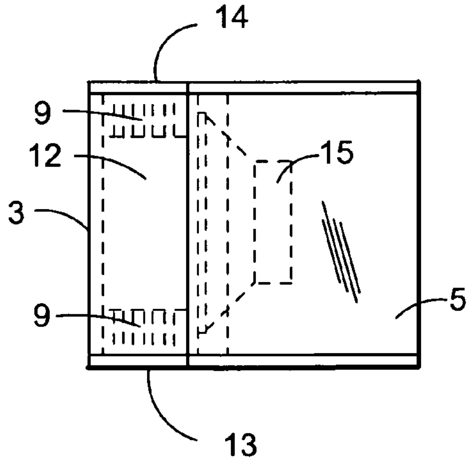
FIG. 3 is a side elevation view of the preferred embodiment.

In the present disclosure, a 15-inch driver 15 is shown. The current invention provides for the use of an 18-inch driver by increasing the vertical height of the enclosure as shown in FIG. 2, without modification to any other dimensions other than suitably increasing the throat opening area also. Additional back chamber volume (Vb) can be achieved by increasing the overall depth of the invention. The Vb shown is approximately 5300 cubic inches.

Figure 1:
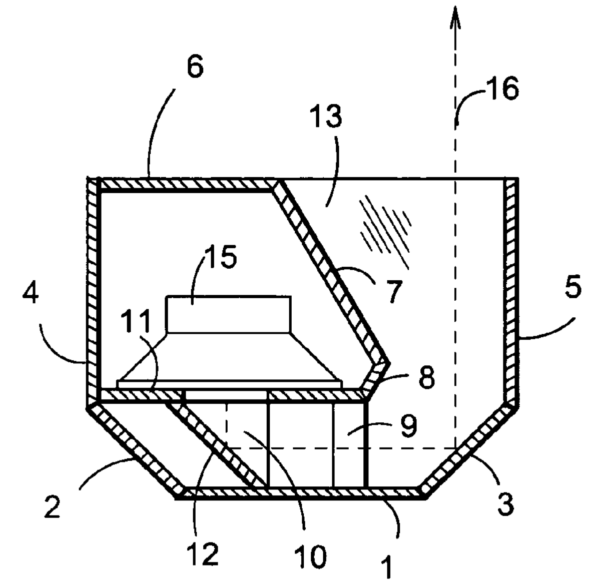
FIG. 1 is a cross-section view showing the preferred embodiment with the top panel removed.
Figure 4:
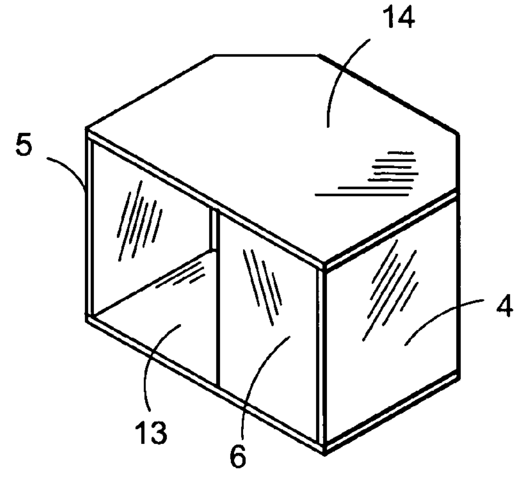
FIG. 4 is a perspective view of the preferred embodiment.

Referring to FIG. 1, the horn sound path is shown by dotted line 16. The pathway contains two 90-degree folds or turns. Waveform "phase" is reversed across the horn channel (as with a mirrored reflection) twice by the full channel reflectors and emerges at the mouth "in phase" with the original waveform, allowing the higher frequencies to transit the folds without cancellation. The throat reflector 12 and the channel reflector 3 are comprised of 45 degree hard surfaces. The non-channel 45-degree external panel 2 corner adaptation corresponding to the channel reflector 3 allows for close cooperating with the walls of a corner when the invention is used horizontally. The back chamber assembly is formed from the side wall part 4, the front panel 6, and the internal channel wall parts 7,8 and the baffle board 11. The void space associated with the back chamber and throat section can be optionally filled with sound absorptive material as needed.

The throat section or assembly is comprised of throat flaring baffles 9, the horizontal baffles 10, the throat reflector 12, and the back panel 1. All are sealed to provide an air-tight channel. The flare rate of the throat section is approximately 60 Hz or an exponential doubling length of 12-inches.

The horn channel formed by the exterior channel wall part 3 and the interior channel wall part 8 is substantially the same as the remainder of the terminal section formed by the exterior channel wall part 5 and the interior channel wall part 7. The flare rate of the terminal section is approximately 38 Hz, or an exponential doubling length of 19.5-inches. The overall height of the invention is 19.5-inches.

The throat opening in the baffle board 11 is shown as being 6-inches wide, which is the maximum depth of the throat section channel.

Access to the driver can be made from the bottom 13 or the top panel 14 or preferably by making the internal channel wall part 7 removable.

Figure 5:
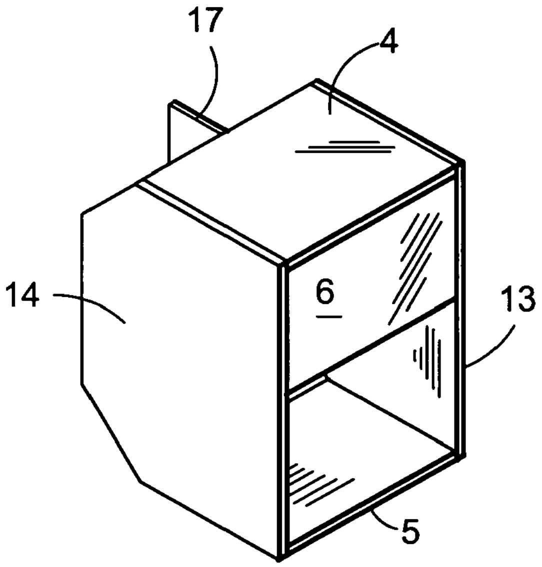
FIG. 5 is a perspective view of the invention standing vertically with additional bracing.

Referring to FIG. 5, the optional brace 17 is shown. The brace 17 is desirable when a top cabinet is to be stacked on the invention to provide stability as needed. The brace 17 may optionally be used both top and bottom, as needed for stability. Preferably, the braces should be user-removable for obvious reasons.

Figure 6:
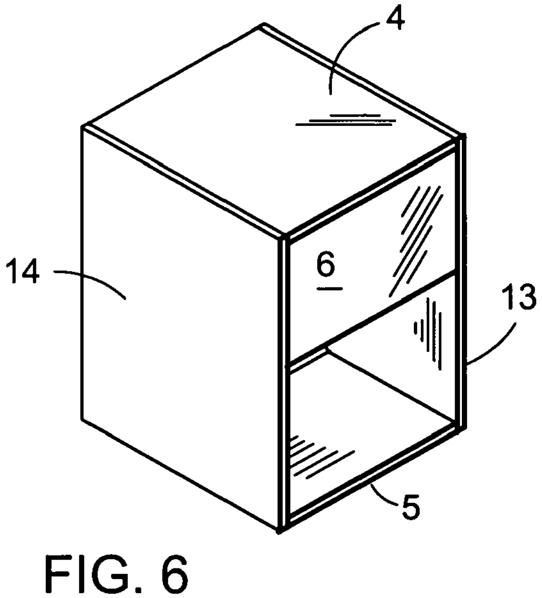
FIG. 6 is a perspective view of a rectangular alternative embodiment standing vertically.

Referring to FIG. 6, an alternative embodiment is shown which is rectangular in outward shape. A benefit of the alternative embodiment is that some additional back chamber volume is easily gained by the rectangular corner without altering the invention dimensionally. The rectangular shape of the alternative embodiment naturally renders the invention compatitively less effective in exploiting true corner placement, and would tend to indicate that the rectangular embodiment would best be used in ½ or ¼ space instead.

Figure 7:
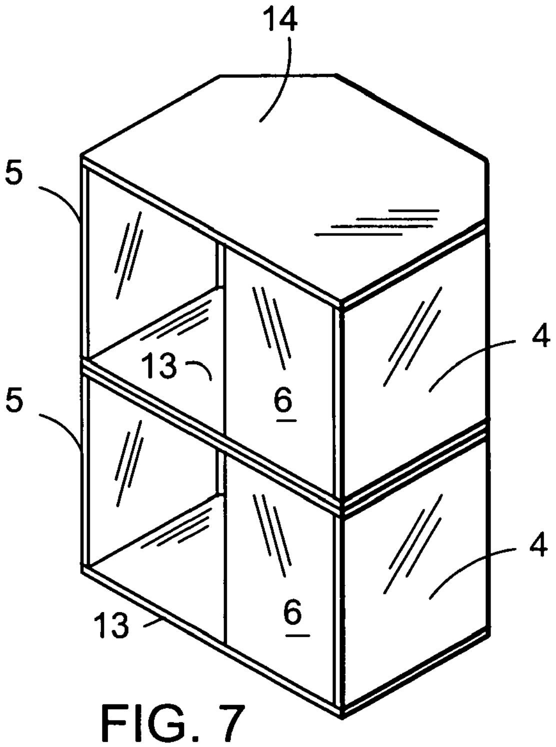
FIG. 7 is a perspective view of the preferred embodiment stacked in a pair for corner placement.

Referring to FIG. 7, the preferred embodiment is shown as a stacked pair. The shape of the invention promotes the efficient use of space and is especially suitable for corner placement where optimized performance may be achieved by close acoustic coupling to the corner walls, and the increased overall mouth area. The shape of the preferred embodiment promotes the reduction of cabinet and horn mouth diffraction events when properly placed in a corner.

Whereas this disclosure depicts one specific type of manufacture, it should not be limited to materials and processes that utilize only straight planar elements, such as plywood and the like. It should also be noted that while straight lines have been used for describing the various horn channels and reflectors, an alternative and perhaps better embodiment could utilize curved or concave elements which would promote an even rotational angle or approximate a true exponential curve more closely.

While in accordance with the provisions of the patent Statutes, the preferred forms and embodiments have been illustrated and described, it will become apparent to those skilled in the art that various changes and modifications may be made without deviating from the inventive concepts set forth above.

I claim:

1. In a folded horn loudspeaker for vertical or horizontal placement, an enclosure comprising:

an assembly of baffles defining a back chamber and a unitary horn pathway comprising two directional changes, said back chamber adapted and arranged to house at least one driver, said each driver being mounted to face rearwardly, said back chamber adapted with at least one throat opening cooperating with said each driver to transmit sound waves to said pathway, said pathway further comprising an outwardly disposed baffle arranged vertically and in a basal angle to cooperate in proximate relation with a corner formed by two walls and a floor or ceiling, said baffle further providing a full channel reflective surface, said pathway having at least two different flare rates and begins at the rear of said enclosure and proceeds perpendicular to a central axis of said enclosure, said pathway further progressing along a side of said back chamber and exhausts frontwardly on one side of a front baffle.

2. In a folded horn loudspeaker as set forth in claim 1, wherein said enclosure is further defined as having parallel side panels suitable for said enclosure to stand upon.

3. In a folded horn loudspeaker as set forth in claim 1, wherein said enclosure is further defined as having parallel top and bottom panels suitable for said enclosure to stand upon.

4. A folded horn enclosure comprising:

an assembly of vertically arranged baffles defining a back chamber and a unitary horn pathway, the rearmost said back chamber baffle being adapted with at least one throat opening therein, said assembly further defined as having outer side baffles arranged in an oppositely disposed spaced plane parallel to a central axis of said enclosure, said back chamber being further defined by one of said outer side baffles, said pathway having a throat section and a terminal section, each said section having at least one different flare rates defined by baffles, and said pathway changing direction in between said sections, said pathway is further defined having two full channel reflecting baffles to turn said pathway, said pathway propagating from and along the rear plane of said enclosure around one side of said back chamber, said throat section being arranged perpendicular to a central axis of said enclosure and flaring vertically, said terminal section being partially defined by a said outer side baffle, and said flaring rate thereof being defined by at least one baffle of said back chamber and thereby flaring horizontally, said enclosure frontally being proportioned more wide than tall, with said pathway exhausting at the front of said enclosure, and means for completing said enclosure.

5. A folded horn enclosure as set forth in claim 4, wherein said back chamber houses at least one driver operating in sealed relation with at least one said throat opening.

6. A folded horn enclosure as set forth in claim 4, wherein said completing means include a top and bottom baffle.

7. A folded horn enclosure as set forth in claim 4, wherein said enclosure is substantially rectangular in external shape.

8. A folded horn enclosure as set forth in claim 4, wherein said enclosure is externally shaped to cooperate in proximate relation with an environment corner formed by the vertical walls and the floor by means of said terminal section reflector and an oppositely disposed external baffle thereby defining both of the rearward outside corners of said enclosure.

9. A folded horn enclosure as set forth in claim 8, wherein said terminal section is optimized for corner low frequency operation when said enclosure is stacked in pairs and said stacked pair is placed in a corner.

* * * * *